(12) United States Patent
Mendiola et al.

(10) Patent No.: US 6,475,880 B1
(45) Date of Patent: Nov. 5, 2002

(54) CASSETTE INVERTOR METHOD

(75) Inventors: Jeffrey K. Mendiola, Meridian; Willard L. Hofer, Boise, both of ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/679,029

(22) Filed: Oct. 4, 2000

Related U.S. Application Data

(62) Division of application No. 09/130,262, filed on Aug. 6, 1998, now Pat. No. 6,254,682, which is a continuation of application No. 08/603,879, filed on Feb. 22, 1996, now Pat. No. 5,858,459.

(51) Int. Cl.⁷ .......................... H01L 21/46; H01L 21/78; H01L 21/301
(52) U.S. Cl. ........................................ 438/464; 438/456
(58) Field of Search ................. 438/106, 114, 438/119, 128, 460, 464, 465, 118, 456, 458

(56) References Cited

U.S. PATENT DOCUMENTS

| | | | | |
|---|---|---|---|---|
| 3,610,397 A | * | 10/1971 | Bok | 427/534 |
| 3,850,319 A | * | 11/1974 | DiFrank et al. | 414/802 |
| 4,004,045 A | * | 1/1977 | Stelter | 427/542 |
| 4,370,356 A | * | 1/1983 | Bok et al. | 198/404 |
| 5,147,176 A | * | 9/1992 | Stolzer et al. | 414/786 |
| 5,270,079 A | * | 12/1993 | Bok | 427/429 |
| 5,364,573 A | | 11/1994 | Noky | 156/256 |
| 5,368,645 A | * | 11/1994 | Bok | 118/500 |
| 5,697,246 A | * | 12/1997 | Kuroda et al. | 72/356 |
| 5,858,459 A | | 1/1999 | Mendiola et al. | 427/209 |
| 5,919,713 A | * | 7/1999 | Ishii et al. | 438/464 |
| 6,281,096 B1 | * | 8/2001 | Ewer | 438/464 |

* cited by examiner

Primary Examiner—Hoai Ho
Assistant Examiner—Phuc T. Dang
(74) Attorney, Agent, or Firm—Kirkpatrick & Lockhart LLP

(57) ABSTRACT

A method of inverting a plurality of plate-like materials. One form of the method may include supporting the plurality of plate-like materials in an orientation such that the plate-like materials are substantially parallel to each other in a first orientation. The method may also include engaging portions of each plate-like material to retain the plate-like materials in the substantially parallel orientation to each other, and simultaneously inverting the plate-like material to a second orientation.

10 Claims, 3 Drawing Sheets

CASSETTE INVERTOR METHOD

This is a divisional application of U.S. patent application Ser. No. 09/130,262, filed Aug. 6, 1998, and issued as U.S. Pat. No. 6,254,682 on Jul. 3, 2001 and which is a continuation of U.S. patent application Ser. No. 08/603,879, filed on Feb. 22, 1996, and issued as U.S. Pat. No. 5,858,459 on Jan. 12, 1999.

BACKGROUND OF THE INVENTION

1. Field of the Invention

The present invention relates to manipulation of bulk quantities of plate-like material. More particularly, the present invention relates to inverting a plurality of flat panel substrates and the like contained in a cassette-type carrier.

2. Description of the Invention Background

Many advances in the fields of electronics and optics, as well as other fields, have resulted from the development of multilayered plate-like devices, such as flat panel displays, optical devices, printed circuit boards and integrated circuits, that provide for more efficient performance of sequential operations. The performance characteristics of the multi-layered devices are precisely determined by the composition, the dimensions and the surface characteristics of the individual layers. In the electronics industry, the desire for faster operating speeds and increased storage capacities have motivated advances in the miniaturization of components that has placed increasing demands on the capabilities of electronics manufacturers. In response to those demands, manufacturers have developed new techniques that are directed toward meeting the increased expectations of the industry.

One way to reduce the size of the device is to produce the devices having thinner layers thereby reducing the profile of the devices. A reduction in thickness can be realized especially for those layers in which the performance of the device is not dependent on the thickness of the layer, but merely depends on the presence of the layer, such as with insulating layers and the like. An equally strong motivation to produce thinner coating layers is that the coating materials, in many instances, are relatively expensive; therefore, a reduction in the thickness of the layers directly reduces the manufacturing cost of the device.

The most common method of coating the surface involves dipping the device into the coating material. This method, while providing for full coverage of the device does not produce consistent nor predictable coating thickness due to inherent slight variations in the coating properties and the numerous process conditions.

An alternative technique developed to produce coating layers that are thinner than normally achievable by dipping is to spin coat the material onto the substrate. In spin coating methods, a coating is applied to the surface of the substrate and then the substrate is spun at a sufficiently high rate, such that the rotational force developed by the spinning motion will cause the coating material to distribute over the surface of the substrate and a portion of the coating material will be spun off the substrate depending upon the strength of the rotational force. A problem with this method is that a significant amount of coating material is wasted, which increases overall production costs of the devices. In addition, the method may not provide a uniform thickness layer if the topography of the substrate is sufficiently rough, because the raised portions of the surface will tend to retain coating material that would otherwise have been spun off, thereby resulting in localized thickness variations.

A current preferred technique to produce thin coating layers involves performing a meniscus coating of the surface, as is disclosed in U.S. Pat. Nos. 4,370,356 and 5,270,079 to Bok. In the meniscus coating process, the surface of a substrate to be coated is oriented downward and the substrate is moved relative to a coating applicator such that the bottom surface is brought into sufficiently close proximity to the coating applicator so as contact the coating material flowing from the applicator. The coating material forms a meniscus on the surface of the substrate that forms a uniform thin layer of the bottom surface as the substrate is moved relative to the applicator. The coating thickness is controlled by the distance between the applicator and the substrate surface and the flow of coating material through the applicator. This technique is capable of producing uniform coatings with thicknesses of less than a few microns. One inherent problem with this technique is that the surface to be treated must be facing downward, whereas in most other processes the surface to be treated must be facing upward and that typically the handling of the substrates is performed using the bottom of the substrate.

In addition, some multilayered devices, such as those used in optics, are produced by depositing layers on both sides of a substrate. Those types of devices presenting special handling and processing problems because handling of either side of the plate-like material can damage the layers affecting the performance of the device. The difficulty in handling those materials results in increased production costs due to the lower overall production yield. In addition, the increased complexity and amount of equipment and floor space required to produce those devices and the resulting longer processing times also serves to increase the production costs of devices that are coated on both sides.

Currently, plate-like materials that are to be treated using a meniscus coating technique or other techniques involving treating the material from below or on both sides can be handled in two ways. One method is disclosed in U. S. Pat. No. 3,610,397 issued Oct. 5, 1971 to Bok (the "'397 patent"). In the practice of the '397 patent, individual plates having first and second sides are transported along a conveyor belt with the second side of the plate in contact with the belt. The plates are passed in successive fashion through processing stages in which the first side of the plate is treated from above the plate. In order to perform the meniscus coating of the first surface from beneath the plate or to coat the second side of the plate, the plate is flipped over using a turnover device, so that the first side of the plate is in contact with the belt. Following either meniscus coating of the first side or coating of the second side, the plate must again be flipped over, using a turnover device or some other appropriate method to return the plate to its original orientation.

A problem with conveyor-type apparatuses and methods is that additional or more complex processors are required to handle the material. This results in increased equipment costs and floor space requirements. Also, the '397 patent recognizes the problems associated with individually turning over each plate twice in the prior art; however, the patent only discloses an apparatus intended to lessen the possibility of damage to the plate through the use of less complex machinery to perform the flipping operations. Another problem in the prior art, not addressed by the '397 patent, is when both sides of the material are to be treated, such as in optical applications, a freshly treated surfaces must be brought into contact with handling equipment. The contact with the handling equipment may damage the layers on the substrate and may also require increased processing times to allow the freshly treated surface to dry or harden prior to handling the surface.

A second method is disclosed in U.S. Pat. No. 5,368,645 issued Nov. 29, 1994 to Bok (the "'645 patent") involves the use of a vacuum chuck to invert the substrate or plate, thereby positioning the surface of the plate facing downward for treatment using the meniscus coating technique. In the '645 patent, a plate with the surface to be treated facing upward is positioned on a rotatable vacuum chuck. A vacuum is drawn through the chuck which holds the plate against the chuck and the chuck is rotated 180° so that the surface to be treated is facing downward. The meniscus coating is applied to the plate and the vacuum chuck is returned to the upright position and the vacuum is released.

The use of vacuum chuck provides a solution to some of the problems associated with the prior art in that less additional equipment and floor space is necessary; however, the use of the vacuum chuck still requires the plates to be individually inverted, and a vacuum to be drawn and released, all of which increases the processing time and the potential for damage to the plates presented by individual handling of the material. Additionally, the vacuum chuck apparatuses, like the conveyor belt apparatuses, are not suitable for handling material that is to be treated on both sides.

The present invention is directed to providing a method and an apparatus for efficiently inverting plate-like material in bulk which overcomes, among others, the above-discussed problems so as to minimize the handling and processing equipment necessary to treat both sides of the plate-like material and to increase productivity and yield by minimizing damage to the material resulting from material handling operations.

SUMMARY OF THE INVENTION

The above objects and others are accomplished by a cassette invertor apparatus and method in accordance with the present invention. The cassette invertor apparatus of the present invention is provided for inverting plate-like material in bulk by securing the plate-like material in a cassette-type carrier, rotating both the cassette and the plate-like material and by moving the plate-like material between the rail surfaces of the cassette in a restrained manner. The cassette invertor apparatus includes a base, a back attached to the base, a top that is removably attachable to the back in a manner so as to secure a cassette positioned between the top and the base and retractable material holders attached to the base for engaging and disengaging the plate-like material. In a preferred embodiment, the retractable material holders are in the form of directly opposing retractable support blocks having notches corresponding the edges of the plate-like material. The blocks are reciprocally moved by a side actuator to enable the support blocks to engage and disengage the plate-like material. Also in a preferred embodiment, support block actuators are attached to the support blocks to provide for restrained movement of the plate-like material between the surfaces of the cassette rails, and top actuators are provided to separate the top from the back of the apparatus. In alternative embodiments, beveled notches in the support blocks are used to provide restrained movement of the plate-like material between the surfaces of the cassette rails.

Accordingly, the present invention provides effective solutions to the problems present in the handling of plate-like materials that are to be treated using techniques that require the material to be inverted, such as meniscus coating techniques, and also for materials that must be treated on both sides. As this invention provides an effective means for inverting plate-like material in bulk, the problems caused by individually inverting each plate are eliminated. In addition, when materials are to be treated on both sides, the present invention does not require that the first surface be placed in contact with the handling equipment after processing and as a result the potential for damage to the treated surface is greatly reduced. These and other details, objects, and advantages of the invention will become apparent as the following detailed description of the present preferred embodiment thereof proceeds.

BRIEF DESCRIPTION OF THE DRAWINGS

The preferred embodiment of the present invention will be described in greater detail with reference to the accompanying drawings, wherein like members bear like reference numerals and wherein.

DETAILED DESCRIPTION OF THE PREFERRED EMBODIMENTS

Figure 1:
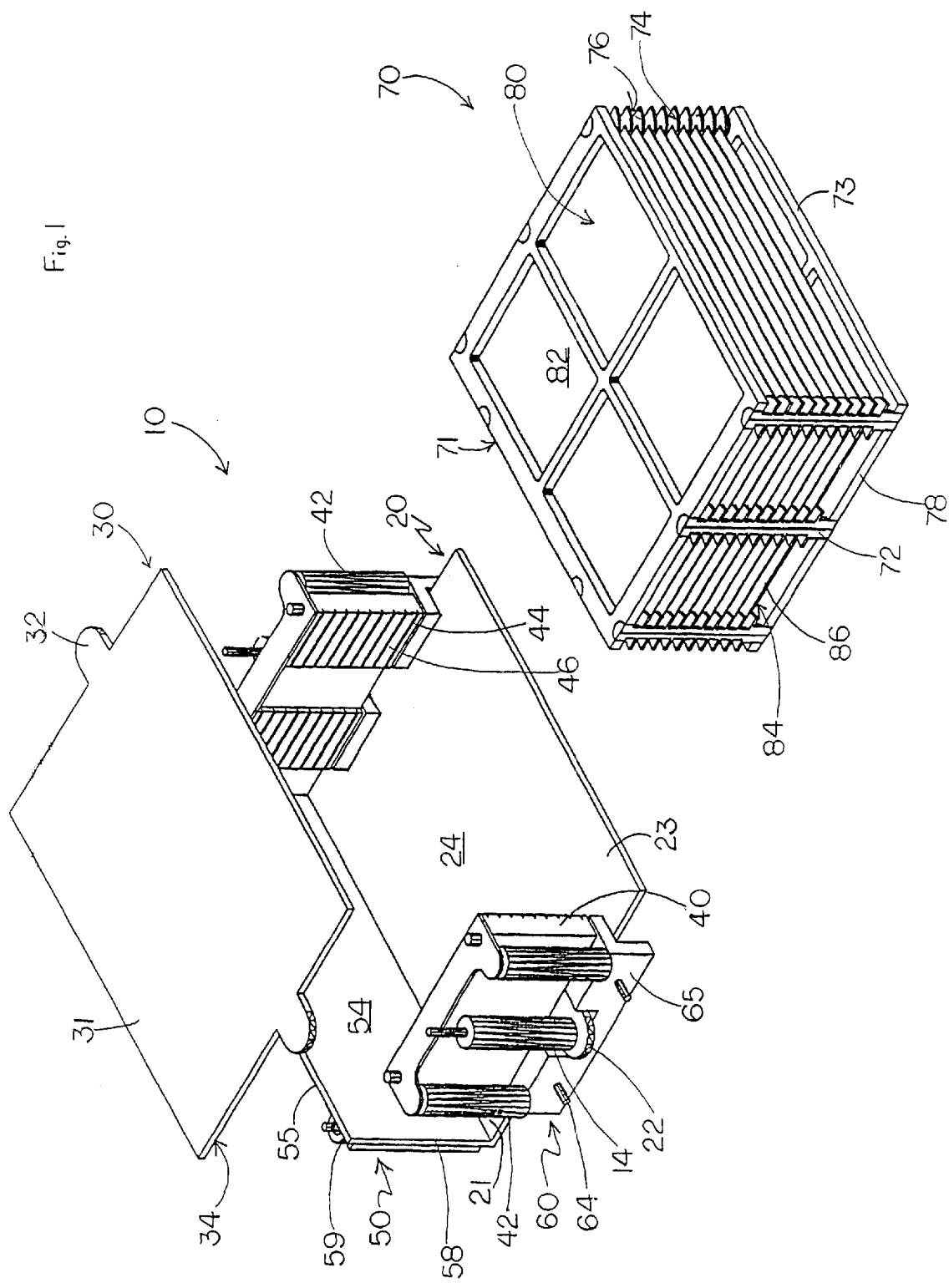
FIG. 1 is a front perspective partially exploded view of a preferred embodiment of the present invention with the top removed from the apparatus for clarity.
Figure 2:
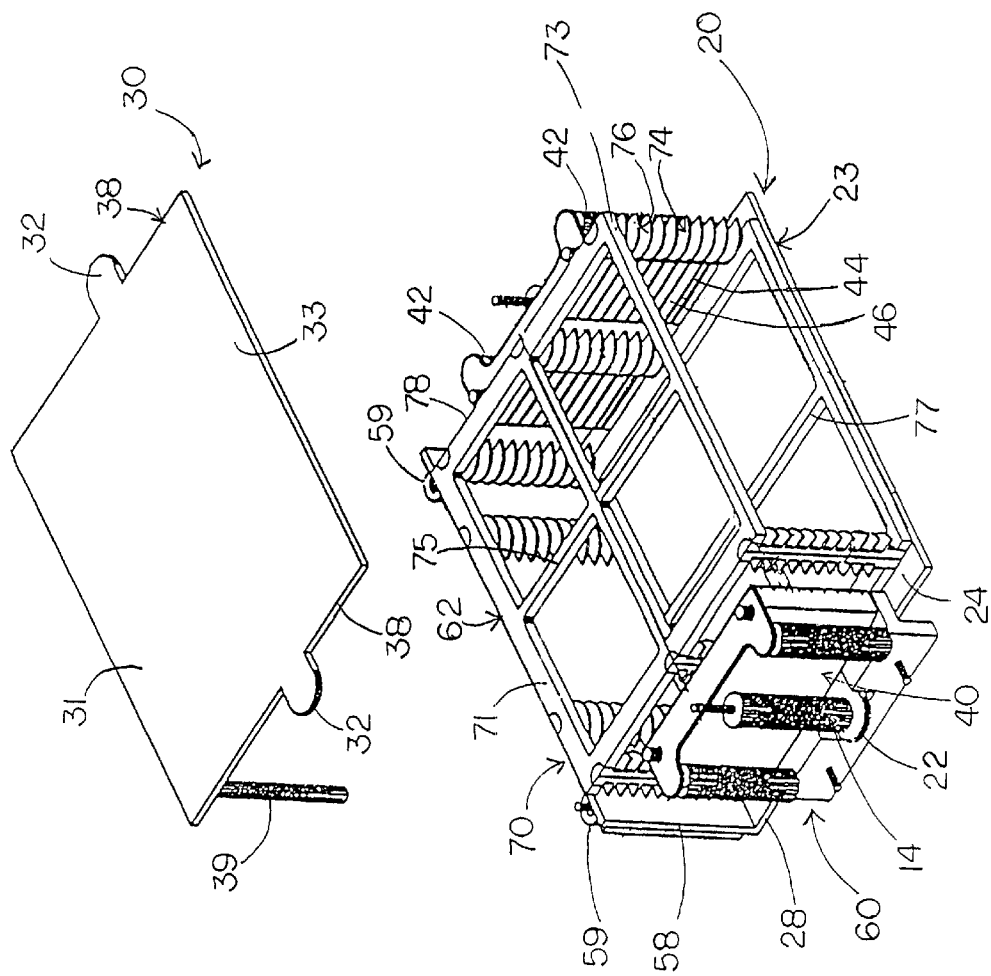
FIG. 2 is a front perspective view of a preferred embodiment of the present invention with an empty cassette in the apparatus; and, FIG. 3 is a back perspective view of a preferred embodiment of the present invention showing the back of the apparatus and the side actuator.

The operation of the cassette invertor apparatus 10 will be described generally with reference to the drawings for the purpose of illustrating present preferred embodiments of the invention only and not for purposes of limiting the same. The cassette invertor apparatus 10 of the present invention serves to invert a cassette 70 containing a plurality of sheets of plate-like material 80 so that both sides of the plate-like material 80 can be treated using the same equipment, thereby reducing equipment redundancy and complexity and minimizing the floor space required to perform the procedure. FIGS. 1, and 2, respectively, show one embodiment of the cassette invertor apparatus 10 without and with a cassette 70 in place. While preferred embodiments of the invention will be discussed with respect to inverting a plurality of flat panels contained in a rectangular shaped cassette 70, one skilled in the art will appreciate that the invention can be suitably modified for use with other plate-like material and carriers that may require treatment on both sides of the material, such as semiconductor substrate wafers and the like.

In a preferred embodiment, the cassette invertor apparatus 10 is provided for a cassette 70 having two substantially open opposing support sides 78, and open front side 73, a substantially open supporting back side 71, a top face 75 and a bottom face 77. The plate-like materials 80 are seated on and supported by either the top or base rail surfaces, 74 and 76, respectively, of the supporting rails 72 depending upon the orientation of the apparatus 10.

The apparatus 10 includes a base 20, a back 50 attached to the base 20 and a top 30 that is removably attached to the back 50 in a manner so as to be capable of securely holding the cassette 70 between the top 30 and the base 20 without obstructing the open front side 73 of the cassette 70. In a preferred embodiment the top 30, the base 20, and the back 50, are constructed of anodized aluminum; however, any material of construction having sufficient strength to support the weight of the plate-like material 80 and the carrier 70 is acceptable.

The base 20 is substantially rectangularly shaped having base tabs 22 extending from opposing sides 28, a back portion 21, a front portion 23, an inner surface 24 and an outer surface 26. The dimensions of the base 20 from the front portion 23 to the back portion 21 are preferably substantially equivalent to the distance between the open front side 73 and the back side 71 of the cassette 70. Preferably, the distance between opposing sides 28 is sufficiently larger than distance between opposing sides 78 of the cassette 70, to allow for attachment of movable side blocks 60 (described below) to the base 20. The base tabs 22 are centered along the respective opposing sides 28 and are preferably semicircular in shape and of a sufficient radius to allow a top actuator 14 to be mounted on the inner surface 24.

Preferably, the back 50 is substantially rectangularly shaped and has a top portion 55, a bottom portion 57, an inner surface 54, an outer surface 56 and opposing sides 58 of substantially the same dimensions as the distance between the opposing surfaces 28 of the base 20. The dimensions of the back 50 from the bottom portion 57 to the top portion 55 are preferably, substantially equivalent to the distance between the top face 75 and the bottom face 77 of the cassette 70. The back 50 is attached at substantially a right angle to the back portion 21 of the base 20. A pivot 51 is mounted to the outer surface 58 in the center of the back 50 to provide for rotation of the cassette invertor apparatus 10 in the plane of the outer surface 56 of the back 50. Two cylindrical post receivers 59 are attached to the top portion 55 of outer surface 56 of the back 50 near respective opposing sides 58. The post receivers 59 are axially oriented perpendicular to the base 20 and are used in combination with the guide posts 39 attached to the top 30 to guide the top 30 into position relative to the back 50.

The top 30 is preferably substantially the same shape and dimensions as the base 20, having tabs 32 extending from opposing sides 38, a back portion 31, a front portion 33, and an inner surface 34. The top 30 is attached to the back 50 by the top actuators 14 and through the use of two parallel mounted cylindrical guide posts 39 that are sized and positioned to be received in the post receivers 59 on the back 50. The guide posts 39 are attached to the back portion 31 of the top 30 perpendicular to the inner surface 34, so that when the top 30 is attached to the back 50, the top 30 directly opposes the base 20. The top actuators 14 are attached to the underside of the top 30 and serve to raise the top 30 so apparatus 10 can receive a cassette 70 and top 30 can be lowered to retain cassette 70 in apparatus 10. Other alternative embodiments for securing the top 30 to the back 50, such as open and close hinge arrangements, locking mechanisms, straps or using a removable top 30 secured by a friction fit between guide posts 39 and post receivers 59, are also contemplated in the practice of the present invention.

While a current preferred embodiment is for the base 20, the top 30 and the back 50 to be solid members dimensionally comparable to the dimensions of the cassette 70, alternative embodiments, such as the use of frame-like members or members of differing sizes to support the cassette 70 may also be used with the present invention.

In a preferred embodiment, two top actuators 14 are mounted on the inner surface 24 of the respective base tabs 22 and attached to the respective top tabs 32 on opposing sides 28 of the base 20. The top actuators 14 are used to raise and lower the top 30 with respect to the back 50. The top actuators 14 are preferably air actuated, such as those manufactured by Bimba Corporation, Monee, Ill. 60449-0068. However, other type actuators, such as hydraulic or mechanical, may be used with the invention. In alternative embodiments, such as those using a locking mechanism, the top actuator 14 may not be necessary to practice the present invention.

In a preferred embodiment, retractable material holders in the form of notched support blocks 40 are used to secure the plate-like material 80 within the cassette 70, when the cassette 70 is being inverted. Preferably, two movable support blocks 40 are respectively positioned on opposing sides 28 of the base 20 so that the support blocks have directly opposing faces 46 containing directly corresponding horizontal notches 44 of dimensions suitable for engaging the edges 86 of the plate-like material 80. The support blocks 40 are reciprocally movable to provide for the engagement and disengagement of the edges 86 of the plate-like material 80 in the notches 44 of the support blocks 40. The portion of the faces 46 that directly oppose the support rails 72 of the cassette 70 are not notched and are also recessed to allow the notched portion of the support blocks to be reciprocated through the open portions of the opposing sides 78 of the cassette 70 without interference from the support rails 72. Two directly opposing support blocks 40 with faces 46 having recessed unnotched portions are preferred to support the plate-like material 80, so as to eliminate any bending moment that may result from other support configurations, while minimizing any potential for damage to the material 80 that may result from additional contact with the apparatus 10. However, other configurations and supports may be employed as necessary depending on the type of carrier 70 used to hold the material 80 and the plate-like material 80 itself. The positioning of the support blocks 40 directly facing the opposing sides 78 of the cassette 70 is additionally preferred so that the plate-like material 80 can be removed from the cassette 70 without having to remove the cassette 70 from the apparatus 10. However, the present invention can be practiced using other support block 40 arrangements as may be necessary to accommodate other carrier designs, such as those designs that only provide sufficient access to the edges 86 of the material 80 through the open front side 73, where the material 80 is placed into and taken out of the cassette 70.

Preferably, reciprocal movement of the support blocks 40 is provided by mounting the support blocks 40 to side blocks 60 slidably mounted on opposing sides 28 of the base 20. The slide blocks 60 are preferably "L" shaped and are slidably mounted in an inverted position with the inner horizontal surface 61 contacting the inner surface 24 of the base 20. The vertical portions 65 of the side blocks 60 point toward and extend beyond the outer surface 26 of the base 20. Two parallel guide rods 64 are used to slidably connect the side blocks 60. The guide rods are symmetrical about the center of the side blocks 60 and extend through the vertical portions 65 of the side blocks 60 below the outer surface 26 of the base 20 and provide for reciprocal movement of the side blocks 60 along the guide rods 64. Reciprocal movement of the support blocks 40 is preferably provided by a side actuator 62 which is connected to one side of a rotating hinge 66 mounted on the outer surface 26 in the center of the base 20. Actuator rods 68 are used to connect the side blocks 60 to opposing sides of the rotating hinge 66. The actuation of the side actuator 62 imparts rotational motion to the rotating hinge 66. The rotation of the rotating hinge 66 moves the actuator rods 68 in opposite directions in a reciprocating fashion. The reciprocal movement of the actuator rods in opposite directions moves the side blocks 60 either toward or away from each other depending on the direction of the actuation. The side actuator 62 is preferably air actuated, but other actuators, such as hydraulic or mechanical, may be used with the invention. The side actuator 62 used in such an arrangement provides for reciprocal movement of the side blocks 60 in opposite directions along the guide rods 64, thereby forcing the support blocks 40 into either engagement or disengagement with the edges 86 of the plate-like material 80. While an actuator is a current preferred embodiment for producing reciprocal movement of the support blocks 40, any suitable method of producing reciprocal movement is considered acceptable.

In a preferred embodiment, support block actuators 42 are used to provide for restrained movement of the plate-like material 80 from a rest position on the base rail surface 74 when the apparatus 10 is oriented with the top 30 above the base 20 to a rest position on the top rail surface 76 when the cassette is inverted with the top 30 oriented below the base 20. The support blocks 40 are attached to the support block actuators 42, which are in turn mounted to the side blocks 60. A total of four support block actuators 42 are preferred with two actuators 42 symmetrically attached to each support block 40 and mounted on the outer horizontal surface of the side blocks 60. The support block actuators 42 are preferably air actuated, but other actuators, such as hydraulic or mechanical, may be used with the invention. Also, while actuators are used in a current preferred embodiment for producing reciprocal movement of the support blocks 40, other apparatuses for producing reciprocal movement, such as a friction slide, are contemplated by the present invention. Alternatively, the edges of the notches 44 can be beveled so that the dimension of the notches 44 at the face 46 of the support blocks 40 are substantially equal to the distance between the top and bottom rail surfaces 74 and 76, respectively, such that engagement and disengagement of the material 80 from the support blocks 40 would provide restrained movement of the material between the respective rail surfaces, 74 and 76.

Figure 3:
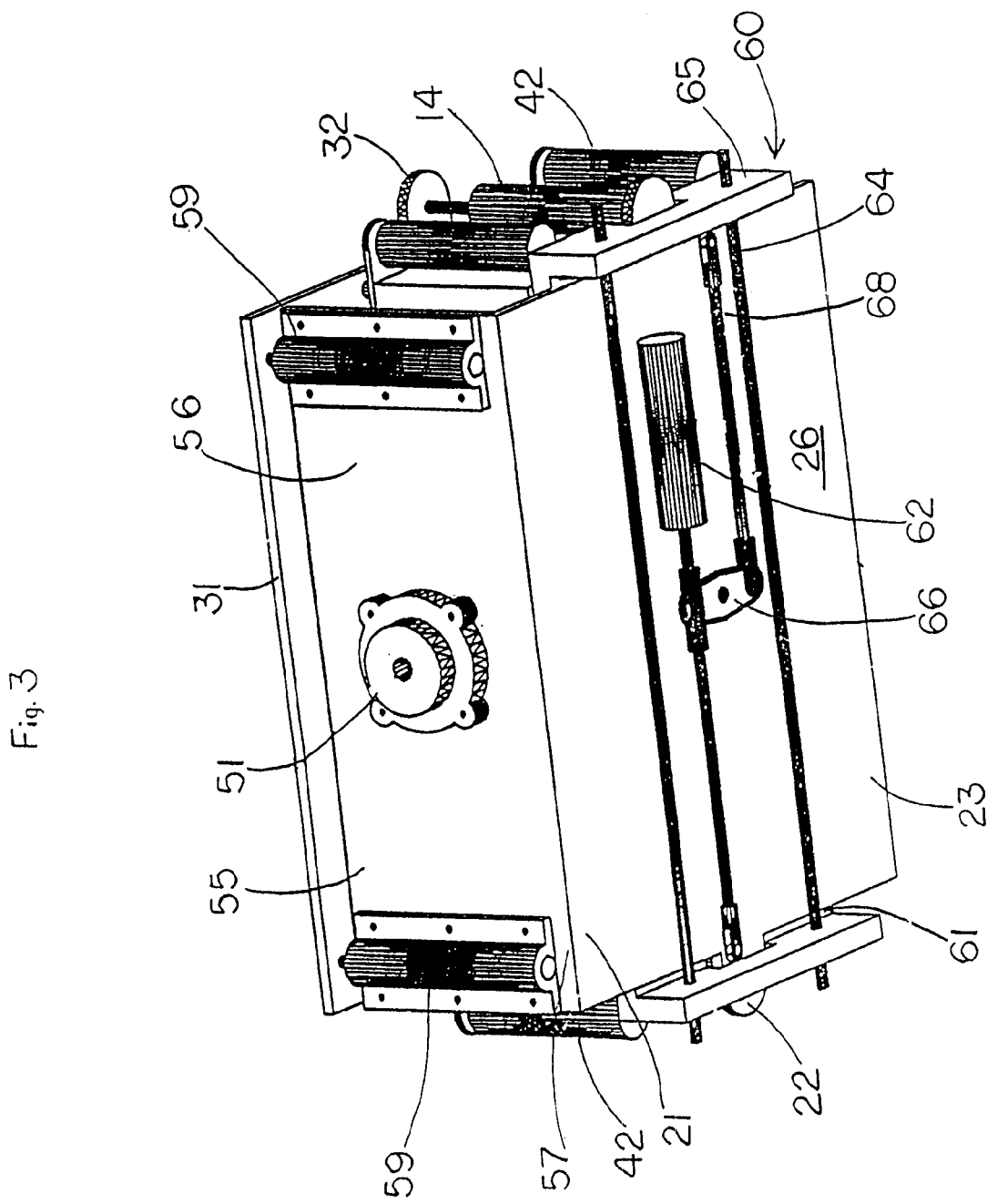

In the operation of the present invention. the top actuators 14 are extended to exert a force sufficient to separate the top 30 from the back 50. A cassette 70 containing plate-like material 80 seated on the base rail surfaces 74 is positioned with the bottom face 77 of the cassette 70 contacting on the inner surface 24 of the base 20 between the support blocks 40 and with opposing sides 78 directly opposing support blocks 40 and back side 71 contacting the inner surface 54 of the back 50. The top 30 is lowered onto the back 50 by retracting the top actuators 14 and the cassette 70 is held between the top inner surface 34 and the base inner surface 24. The side actuator 62 is actuated to move the opposing side blocks 60 toward each other along guide rods 64, thereby causing the opposing support blocks 40 to move toward each other, and engage the edges 86 of the plate-like material 80 which mate with and are retained in the notches 44 of the support blocks 40. The cassette invertor apparatus 10 is then rotated 180° about the pivot 51 so that the top 30 and the base 20 have essentially exchanged positions and the back 50 occupies essentially the same position but is oriented 180° out of phase from its original position. The block actuators 42 are extended and the support blocks 40 are moved toward the top 30 until the plate-like material 80 is in a close proximate relation with base rail surface 76 of the cassette 70. The side actuator 62 is then actuated to move apart the opposing support blocks 40 causing the edges 86 of the plate-like material 80 to disengage the notches 44 and the plate-like material 80 seats on the base rail surface 76. In the case of applying a meniscus coating, the plate-like material 80 is then removed from the cassette 70 and the first surface 82 is processed from beneath the plate-like material 80 using a meniscus coating applicator graphically represented as 81 in FIG. 3 or any other bottom surface treatment technique as is known in the art, after which the plate-like material 80 is returned to the cassette 70. The side actuator 62 is again actuated causing the support blocks 40 to move toward each other, and engage the edges 86 of the plate-like material 80 which mate with and are retained in notches 44 in the support blocks 40. The cassette invertor apparatus 10 is then rotated 180° about the pivot 51 and the apparatus 10 and cassette 70 are returned to their original positions. The block actuators 42 are actuated to move the support blocks 40 toward the base 20 until the plate-like material is in a close proximate relation with top rail surface 74 of the cassette 70. The side actuator 62 is then actuated to move side blocks 60 and support blocks 40 apart causing the edges 86 of the plate-like material 80 to disengage from the notches 44 and the plate-like material 80 seats on the top rail surface 74. The top actuators 14 are again extended to separate the top. 30 from the back 50. The cassette 70 containing the plate-like material 80 can then be removed from the apparatus 10.

Those of ordinary skill in the art will appreciate that the present invention provides great advantages over the prior art for treating plate-like materials using surface treatment techniques that require application of a coating in a direction other than from above the material. Also, the subject invention eliminates the need to place a freshly treated surface in contact with other surfaces and is designed such that the same equipment can be used to process both sides of the material resulting in reduced equipment costs and other operating costs such as those associated with reduced space requirements. In addition, the present invention can be integrated into a fully automated procedure, but is also suitable for manual handling of the plate-like material. Thus, the present invention provides a significant reduction in the overall cost associated with the production of plate-like material and a commensurate increase in the overall quality of the treated material. While the subject invention provides these and other advantages over other apparatuses for handling plate-like material, it will be understood, however, that various changes in the details, materials and arrangements of parts which have been herein described and illustrated in order to explain the nature of the invention may be made by those skilled in the art within the principle and scope of the invention as expressed in the appended claims.

What is claimed is:

1. A method of inverting a plurality of plate-like materials, said method comprising:

supporting the plurality of plate-like materials in an orientation such that the plate-like materials are substantially parallel to each other in a first orientation;

engaging portions of each plate-like material to retain the plate-like materials in the substantially parallel orientation to each other; and simultaneously inverting the plate-like materials to a second orientation.

2. The method of claim 1 wherein said engaging portions comprises engaging opposing edges of each plate-like material.

3. The method of claim 1 wherein said simultaneously inverting comprises simultaneously rotating all of the plate-like materials about a pivot axis.

4. A method of inverting a plurality of plate-like materials supported within a cassette, said method comprising:

restraining each plate-like material within the cassette; and rotating the cassette about a pivot axis.

5. The method of claim 4 wherein said restraining comprises engaging portions of each plate-like material.

6. The method of claim 5 wherein said engaging portions comprises simultaneously engaging opposing edges of each plate-like material.

7. A method of simultaneously inverting plate-like materials, said method comprising:

forming a stack of plate-like materials;

engaging portions of each plate-like material within the stack; and rotating the stack about a pivot axis.

8. The method of claim 7 wherein said forming a stack comprises supporting each plate-like material in parallel relationship to each other.

9. The method of claim 8 further comprising clamping the stack between two surfaces prior to said engaging.

10. A method for applying a surface treatment to semiconductor wafers comprising:

forming a stack of semiconductor wafers separately supported at their respective edges;

retaining the semiconductor wafers within the stack;

inverting the stack of semiconductor wafers;

removing a semiconductor wafer from the stack; and applying a surface treatment to the semiconductor wafer.

* * * * *

UNITED STATES PATENT AND TRADEMARK OFFICE
CERTIFICATE OF CORRECTION

PATENT NO.    : 6,475,880 B1
DATED         : November 5, 2002
INVENTOR(S)   : Mendiola et al.

It is certified that error appears in the above-identified patent and that said Letters Patent is hereby corrected as shown below:

<u>Column 2,</u>
Line 8, after "so as" insert -- to -- therein.
Line 62, delete "surfaces" and insert -- surface -- therefor.

Signed and Sealed this

Third Day of June, 2003

JAMES E. ROGAN
*Director of the United States Patent and Trademark Office*